US 8,680,526 B2

United States Patent
Nakayama et al.

(12) United States Patent
(45) Date of Patent: Mar. 25, 2014
(10) Patent No.: US 8,680,526 B2

(54) ELECTRONIC DEVICE, METHOD OF PRODUCING THE SAME, AND DISPLAY DEVICE

(75) Inventors: Masaya Nakayama, Kanagawa (JP); Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 402 days.

(21) Appl. No.: 12/753,916

(22) Filed: Apr. 5, 2010

(65) Prior Publication Data
US 2010/0258806 A1 Oct. 14, 2010

(30) Foreign Application Priority Data

Apr. 8, 2009 (JP) .................... 2009-093693

(51) Int. Cl.
*H01L 33/00* (2010.01)
*H01L 29/49* (2006.01)
*H01L 21/336* (2006.01)

(52) U.S. Cl.
USPC ........ 257/59; 257/57; 257/E33.065; 438/151; 438/286

(58) Field of Classification Search
USPC .................. 257/59, 57; 438/151, 286
See application file for complete search history.

(56) References Cited

U.S. PATENT DOCUMENTS

| 4,420,871 | A | * | 12/1983 | Scheibe | 438/258 |
|---|---|---|---|---|---|
| 4,558,338 | A | * | 12/1985 | Sakata | 257/387 |
| 4,656,492 | A | * | 4/1987 | Sunami et al. | 257/336 |
| 5,177,571 | A | * | 1/1993 | Satoh et al. | 257/336 |
| 5,313,075 | A | | 5/1994 | Zhang | |
| 5,523,240 | A | | 6/1996 | Zhang et al. | |
| 5,668,379 | A | | 9/1997 | Ono et al. | |
| 5,760,854 | A | | 6/1998 | Ono et al. | |
| 5,920,781 | A | * | 7/1999 | Imoto | 438/301 |
| 6,015,991 | A | * | 1/2000 | Wheeler et al. | 257/336 |

(Continued)

FOREIGN PATENT DOCUMENTS

| JP | H04-165679 | 6/1992 |
|---|---|---|
| JP | H06-53504 | 2/1994 |

(Continued)

OTHER PUBLICATIONS

English language translation of following: Office action dated Jun. 18, 2013 from the JPO in a Japanese patent application corresponding to the instant patent application. This office action translation is submitted now in order to supplement the understanding of patent document JP2001-053283, JP2005-036250 and JPH08-64829 which are cited in the office action and are being disclosed in the instant Information Disclosure Statement.

(Continued)

*Primary Examiner* — Colleen Matthews
*Assistant Examiner* — William Harriston
(74) *Attorney, Agent, or Firm* — SOLARIS Intellectual Property Group, PLLC (57) ABSTRACT

An electronic device includes: a substrate; a lower electrode which is provided on the substrate and has an edge portion cross-section having a taper angle of 60° or less; a $SiO_2$ film which is provided on the lower electrode, the $SiO_2$ film including hydrogen atoms in a ratio of 3 atomic % or less, and having a refractive index n of 1.475 or less at a wavelength of 650 nm; and an upper electrode which is provided on the $SiO_2$ film and has an overlapping portion with the lower electrode.

14 Claims, 5 Drawing Sheets

(56) References Cited

U.S. PATENT DOCUMENTS

| | | | |
|---|---|---|---|
| 6,211,040 B1* | 4/2001 | Liu et al. | 438/424 |
| 6,228,745 B1* | 5/2001 | Wheeler et al. | 438/424 |
| 6,353,249 B1* | 3/2002 | Boyd et al. | 257/369 |
| 6,607,947 B1 | 8/2003 | Zhang et al. | |
| 6,731,064 B2* | 5/2004 | Andry et al. | 313/506 |
| 6,946,681 B2* | 9/2005 | Jeong et al. | 257/59 |
| 7,274,040 B2* | 9/2007 | Sun | 257/79 |
| 7,560,733 B2* | 7/2009 | Jeong | 257/59 |
| 7,663,302 B2* | 2/2010 | Shin et al. | 313/504 |
| 7,851,791 B2* | 12/2010 | Lee et al. | 257/42 |
| 2002/0000551 A1* | 1/2002 | Yamazaki et al. | 257/59 |
| 2002/0160554 A1* | 10/2002 | Isobe et al. | 438/151 |
| 2003/0094894 A1* | 5/2003 | Andry et al. | 313/506 |
| 2003/0183857 A1* | 10/2003 | Korenari | 257/288 |
| 2004/0018361 A1* | 1/2004 | Takahashi et al. | 428/428 |
| 2004/0031961 A1 | 2/2004 | Zhang et al. | |
| 2004/0192004 A1* | 9/2004 | Yamazaki et al. | 438/321 |
| 2005/0011757 A1 | 1/2005 | Noda | |
| 2005/0116240 A1* | 6/2005 | Kim et al. | 257/88 |
| 2005/0116305 A1* | 6/2005 | Hwang et al. | 257/401 |
| 2005/0180191 A1* | 8/2005 | Xu | 365/145 |
| 2006/0243949 A1* | 11/2006 | Kato | 252/301.21 |
| 2006/0278948 A1* | 12/2006 | Yamaguchi et al. | 257/444 |
| 2007/0045781 A1* | 3/2007 | Carlson et al. | 257/632 |
| 2007/0173023 A1* | 7/2007 | Okazaki et al. | 438/289 |
| 2008/0173903 A1* | 7/2008 | Imai et al. | 257/231 |
| 2008/0182358 A1* | 7/2008 | Cowdery-Corvan et al. | 438/104 |
| 2008/0237598 A1* | 10/2008 | Nakayama | 257/59 |
| 2009/0033818 A1 | 2/2009 | Nakajima et al. | |
| 2009/0057683 A1 | 3/2009 | Nakajima et al. | |
| 2009/0061574 A1 | 3/2009 | Nakajima et al. | |
| 2009/0101910 A1 | 4/2009 | Zhang | |
| 2009/0206434 A1* | 8/2009 | Hashimoto | 257/432 |
| 2009/0283689 A1* | 11/2009 | Mochizuki et al. | 250/370.14 |
| 2010/0051947 A1 | 3/2010 | Yabuta et al. | |
| 2010/0087021 A1* | 4/2010 | Hsiao et al. | 438/29 |
| 2010/0170696 A1* | 7/2010 | Yano et al. | 174/126.2 |
| 2010/0207014 A1* | 8/2010 | Hashimoto | 250/214.1 |
| 2010/0243868 A1* | 9/2010 | Liu et al. | 250/216 |
| 2011/0057170 A1* | 3/2011 | Tsai et al. | 257/40 |
| 2011/0211609 A1* | 9/2011 | Izu et al. | 372/50.1 |
| 2011/0272008 A1* | 11/2011 | Mungekar et al. | 136/252 |

FOREIGN PATENT DOCUMENTS

| | | |
|---|---|---|
| JP | H08-64829 | 3/1996 |
| JP | H11-212116 | 8/1999 |
| JP | 2001-053283 | 2/2001 |
| JP | 2002-246602 A | 8/2002 |
| JP | 2003-086715 | 3/2003 |
| JP | 2005-036250 | 2/2005 |
| JP | 2005-285830 | 10/2005 |
| JP | 2007-073701 A | 3/2007 |
| JP | 2007-250982 A | 9/2007 |
| JP | 2007-258223 A | 10/2007 |
| JP | 2007-335472 A | 12/2007 |
| JP | 2008-205098 | 9/2008 |

OTHER PUBLICATIONS

English language translation of the following: Office action dated Oct. 8, 2013 from the JPO in a Japanese patent application corresponding to the instant patent application. This office action translation is submitted now in order to supplement the understanding of patent document JPH11-212116, JP2005-285830 and JPH04-165679 which are in the office action and are being disclosed in the instant information Disclosure Statement.

English language translation of the following: Office action dated Jan. 7, 2014 from the JPO in a Japanese patent application corresponding to the instant patent application. This office action translation is submitted now in order to supplment the understanding of patent document JPH06-53504, JP2003-186715 and JP2008-205098 which are in the office action and are being disclosed in the instant Information Disclosure Statement.

* cited by examiner

ELECTRONIC DEVICE, METHOD OF PRODUCING THE SAME, AND DISPLAY DEVICE

CROSS-REFERENCE TO RELATED APPLICATION

This Application claims priority under 35 USC 119 from Japanese Patent Application No. 2009-093693, filed on Apr. 8, 2009, the disclosure of which is incorporated by reference herein.

BACKGROUND OF THE INVENTION

1. Field of Invention

The present invention relates to an electronic device, a method of producing the same, and a display device.

2. Description of the Related Art

In general, electronic devices such as thin film transistors (TFT) and condensers (capacitors) have at least two electrodes arranged with an insulating film provided between those.

In recent years, various studies have been conducted regarding insulating films, and thin film transistors (TFT).

For example, a gate insulating film having a columnar structure inclined in the layer thickness direction is known as a gate insulating film capable of reducing leakage current in a thin film transistor (see, for example, Japanese Patent Application Laid-Open (JP-A) No. 2007-258223).

A method of producing a semiconductor device is known which includes forming a semiconductor layer on an insulating surface, forming a gate insulating film on the semiconductor layer, and forming an electroconductive layer on the gate insulating film, in order to improve TFT performance by forming an insulating film on a plastic substrate by sputtering (see, for example, JP-A No. 2002-246602). In the method, the process of forming the gate insulating film includes a first step of forming a first insulating film by sputtering using Si or $SiO_2$ as a target, the first insulating film containing Si, oxygen, and nitrogen as main components and containing hydrogen in a concentration of from 0.4 to 1.6 atomic %; and a second step of forming a second insulating film containing Si and oxygen as main components and containing hydrogen in a concentration of 0.2 atomic % or less.

Furthermore, a gate insulating film for thin film transistors is known which has a favorable boundary surface with a channel layer or a gate electrode. The gate insulating film is an amorphous oxide insulating film containing In, Zn, O, and at least one of Ga, Al, Fe, Sn, Mg, Ca, Si, or Ge, and has a resistance of $10^{11}$ Ω·cm or more (see, for example, JP-A No. 2007-73701).

As a gate insulating film which is used for thin film transistors having oxide semiconductors and has a favorable boundary surface with oxide semiconductors, a gate insulating film is known which is made from an amorphous silicone containing at least oxygen and nitrogen, and has an oxygen concentration distribution in which the oxygen concentration therein is high in a region at the boundary surface with the oxide semiconductor and decreases toward the gate electrode (see, for example, JP-A No. 2007-250982).

Furthermore, a metal oxide device is known which has at least a first electrode formed on a substrate, a metal oxide layer formed on the first electrode, and a second electrode formed on the metal oxide layer, for the purpose of realizing the creation of a memory in which information can be more stably stored. The metal oxide layer includes at least: a base layer formed from at least a first metal and oxygen; and plural fine particles which are formed from the first metal, a second metal, and oxygen and are dispersed in the base layer (see, for example, JP-A No. 2007-335472).

SUMMARY OF THE INVENTION

In recent years, for the purpose of achieving practical use of flexible devices, techniques for producing electronic devices, for example, on a plastic substrate (flexible substrate) at low temperatures have been demanded.

However, when, in particular, electronic devices are formed at low temperatures, the conventional insulating films may fail to suppress the leakage current.

The present invention has been made in view of the above circumstances and provides an electronic device, a method of producing the same, and a display device.

According to a first aspect of the invention, there is provided an electronic device including: a substrate; a lower electrode which is provided on the substrate and has an edge portion cross-section having a taper angle of 60° or less; a $SiO_2$ film which is provided on the lower electrode, the $SiO_2$ film including hydrogen atoms in a ratio of 3 atomic % or less, and having a refractive index n of 1.475 or less at a wavelength of 650 nm; and an upper electrode which is provided on the $SiO_2$ film and has an overlapping portion with the lower electrode.

According to a second aspect of the invention, there is provided a method of producing an electronic device, the method including: forming, on a substrate, a lower electrode which has an edge portion cross-section having a taper angle of 60° or less; forming an insulating film on the lower electrode by sputtering; forming an upper electrode on the insulating film in such a manner that the upper electrode has an overlapping portion with the lower electrode.

DETAILED DESCRIPTION OF THE INVENTION

An electronic device according to the present invention includes: a substrate; a lower electrode (which may be also referred to as a lower electrode film) which is provided on the substrate and has an edge portion cross-section having a taper angle of 60° or less; a $SiO_2$ film which is provided on the lower electrode, the $SiO_2$ film including hydrogen atoms in a ratio of 3 atomic % or less, and having a refractive index n of 1.475 or less at a wavelength of 650 nm; and an upper electrode which is provided on the $SiO_2$ film and has an overlapping portion with the lower electrode.

A method of producing an electronic device according to the present invention includes: forming, on a substrate, a lower electrode which has an edge portion cross-section having a taper angle of 60° or less; forming an insulating film on the lower electrode by sputtering; forming an upper electrode on the insulating film in such a manner that the upper electrode has an overlapping portion with the lower electrode.

In general, electronic devices such as condensers (i.e., capacitors) or thin film transistors (TFT) have configurations in which an upper electrode is provided on a lower electrode with an insulating film disposed between those. In recent years, for the purpose of achieving the practical use of flexible devices, it has been attempted to form an insulating film by sputtering under a low temperature condition of from room temperature to 200° C. to form an electronic device on a plastic substrate (flexible substrate), in stead of using Chemical Vapor Deposition (CVD) that requires a high temperature condition of 300° C. or more.

However, the inventors of the present invention have found the following facts.

That is, when an insulating film is formed by sputtering at a low temperature of 200° C. or less, for example, the coverage (coat ability) of edge portions of a lower electrode (regions in the vicinity of pattern edges) is lower than a case in which the insulating film is formed using CVD. Therefore, in particular, when the lower electrode has an abrupt edge portion (for example, when the taper angle of the below-described edge portion cross-section of the lower electrode exceeds 60°), the coverage of the edge portion of the lower electrode by the insulating film may be low, and hollows or cracks may be generated at regions near edge portion of the insulating film, which may lead to an increase in leakage current.

Meanwhile, even when the taper angle of an edge portion cross-section of a lower electrode, which is described below, is 60° or less, the leakage current may increase depending on the film properties of the insulating film.

When an electronic device has a configuration of the present invention, the leakage current from the insulating film may be reduced in the electronic device.

In the invention, a $SiO_2$ film containing hydrogen atoms in a ratio of 3 atomic % or less may be formed by sputtering. Therefore, the $SiO_2$ film (i.e., an insulating film) used in the invention may be formed at a lower temperature (for example, at 200° C. or less) than a case in which CVD is used.

According to the invention, an electronic device is provided which is produced by a low temperature process (for example, at 200° C. or less) and in which the leakage current is suppressed.

Furthermore, since the electronic device of the invention is formed at a low temperature, the electronic device may be provided on a plastic substrate (flexible substrate) made from a material such as polyethylene naphthalate (PEN) or polyethylene terephthalate (PET).

Therefore, according to the invention, an electronic device which is provided on a plastic substrate and in which the leakage current is suppressed is provided.

In the invention, the "taper angle of an edge portion cross-section" of a lower electrode refers to angle between bottom surface and side surface of the lower electrode.

In the invention, "bottom surface" of a lower electrode refers to a surface of the lower electrode that is in contact with a substrate.

In the invention, "top surface" of a lower electrode refers to a surface of the lower electrode which is parallel to the bottom surface and which is distant from a substrate.

In the invention, "side surface" of a lower electrode refers to any one of the surfaces of the lower electrode other than the top surface and the bottom surface.

In the invention, "pattern edge" of a lower electrode refers to a border line between the lower electrode and a substrate on which the lower electrode is formed, when seen from the lower electrode-forming side (i.e., the side of the substrate at which the lower electrode is formed) in the normal direction of the substrate. In the invention, "pattern edge" of a lower electrode may be also referred to as a "lower edge" of the lower electrode.

In the invention, "upper edge" of a lower electrode refers to a boundary line between the top surface and side surface(s) of the lower electrode.

Hereinafter, the taper angle of an edge portion cross-section of a lower electrode is specifically described with reference to FIG. 1 to FIG. 3.

Figure 1:
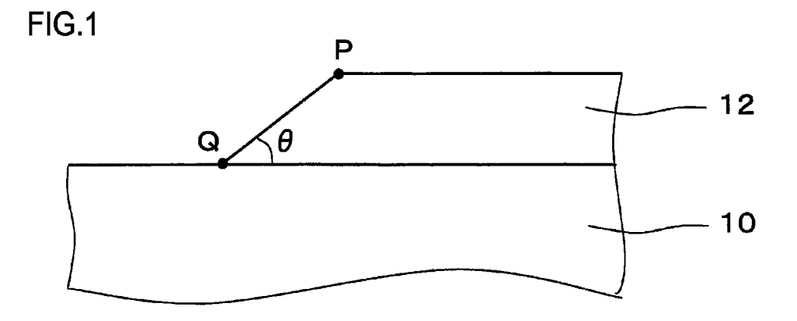
FIG. 1 shows an example of a taper angle of an edge portion cross-section of a lower electrode.
Figure 2:
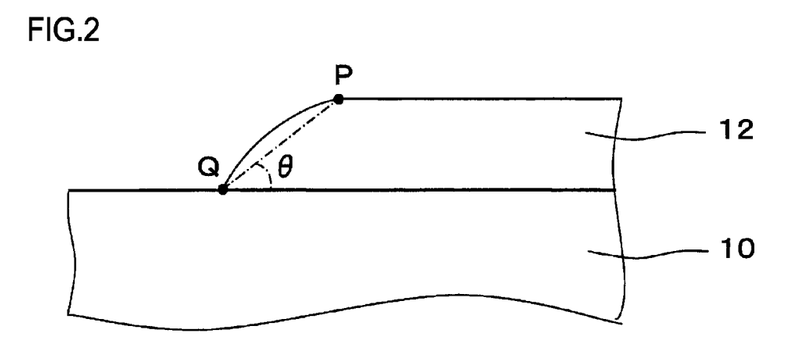
FIG. 2 shows another example of a taper angle of an edge portion cross-section of a lower electrode.
Figure 3:
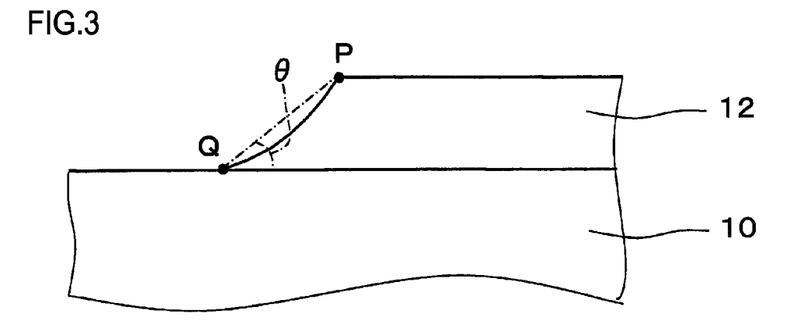
FIG. 3 shows a still another example of a taper angle of an edge portion cross-section of a lower electrode.

FIG. 1 to FIG. 3 are cross-sectional views schematically showing a lower electrode 12 arranged on a substrate 10.

Specifically, FIG. 1 to FIG. 3 each show a cross-section of a lower electrode which is obtained by cutting the lower electrode in a plane perpendicular to a pattern edge thereof and parallel to the normal direction of the substrate.

As shown in FIG. 1, the taper angle θ of an edge portion cross-section of the lower electrode 12 is an angle between the bottom surface and a side surface of the lower electrode 12. More specifically, the taper angle θ is an angle formed by the straight line connecting an upper end P and a lower end Q of the side surface of the lower electrode 12 and the straight line that corresponds to the bottom surface of the lower electrode 12.

FIG. 1 shows an example in which the lower electrode has a flat side surface. The taper angle for a curved side surface of the lower electrode (e.g., the case of FIG. 2 or 3) is defined in the same manner as above.

FIG. 2 shows an example in which the lower electrode has convex side surface curved outward. FIG. 3 shows an example in which the lower electrode has concave side surface curved inward.

Also in the cases of FIGS. 2 and 3, the taper angle θ of the edge portion cross-section of the lower electrode 12 is the angle between the straight line (shown by a dashed-dotted line) connecting upper end P and lower end Q of the side surface of the lower electrode 12 and the straight line corresponding to the bottom surface of the lower electrode 12.

When the taper angle of an edge portion cross-section of the lower electrode exceeds 60°, the leakage current from the insulating film increases.

From the viewpoint of suppressing the leakage current, the taper angle of an edge portion cross-section of the lower electrode is preferably 45° or less, and more preferably 30° or less.

Substrate

The substrate to be used in the invention is not particularly limited. Examples of the substrate include: inorganic substrates made from yttria-stabilized zirconia (YSZ), glass, or the like; and organic substrates (which may be referred to as plastic substrates or flexible substrates herein) made from a synthetic resin such as a polyester (such as polyethylene terephthalate (PET), polybutylene terephthalate, or polyethylene naphthalate (PEN)), polystyrene, polycarbonate, polyether sulfone, polyallylate, allyl diglycol carbonate, polyimide, polycycloolefin, norbornen resin, or poly(chlorotrifluoroethylene), or the like.

Of these, plastic substrates are preferable from the viewpoint that the effects of the invention are more effectively exerted when an insulating film is formed at a low temperature.

It is preferable that the plastic substrates have excellent heat resistance, excellent dimensional stability, excellent solvent resistance, excellent insulation properties, excellent workability, low aeration properties, low moisture absorbency, or the like. Nevertheless, in general, plastic substrates have poor heat resistance; therefore, when a device is formed on a plastic substrate, the formation process is performed at a temperature of preferably 200° C. or less, more preferably 150° C. or less, and particularly preferably 100° C. or less.

The plastic substrate to be used in the invention may have at least one of a gas barrier layer that prevents penetration of moisture or oxygen, an undercoat layer that improves planarity of the plastic substrate or that improves adhesion between the plastic substrate and the lower substrate, or the like.

The substrate to be used in the invention preferably has a thickness of from 50 μm to 500 μm.

When the thickness of the substrate is 50 μm or more, the planarity of the substrate itself further improves.

When the thickness of the substrate is 500 μm or less, the flexibility of the substrate itself further improves, and it makes the substrate more suitable to be used as a flexible substrate.

Lower Electrode

The electronic device of the invention has a lower electrode having an edge portion cross-section having a taper angle of 60° or less. It is preferable that all of the edges of the lower electrode have a taper angle of 60° or less.

The lower electrode to be used in the invention may have, for example, any of the following configurations: (1) when the electronic device of the invention is a capacitor, the lower electrode is one of a pair of electrodes provided in the capacitor; (2) when the electronic device of the invention is a bottom gate thin film transistor, the lower electrode is a gate electrode provided in the thin film transistor; and (3) when the electronic device of the invention is a top gate thin film transistor, the lower electrode is a source electrode or a drain electrode provided in the thin film transistor. The lower electrode may be a stripe electrode, and two or more thereof may be arranged in parallel to form a pattern.

The material of the lower electrode is not particularly limited. Examples of the material include metals such as Al, Mo, Cr, Ta, Ti, Au, and Ag; alloys such as Al—Nd, APC, and Mo—Nb; oxide electroconductive compounds such as tin oxide, zinc oxide, indium oxide, indium tin oxide (ITO), and indium zinc oxide (IZO); organic electroconductive compounds such as polyaniline, polythiophene, and polypyrrole; and mixtures thereof.

Of these, from the viewpoint of facilitating adjustment of the taper angle of an edge portion cross-section of a lower electrode to 60° or less, Mo—Nb or oxide electroconductive compounds are preferable, and it is more preferable that the lower electrode is a film made from one or more oxide electroconductive compounds (the film made from one or more oxide electroconductive compounds may be also referred to as an oxide electroconductive film).

The oxide electroconductive film is more preferably an amorphous oxide electroconductive film made from IZO or the like.

When IZO is used, an edge portion of the lower electrode formed is spontaneously oxidized, thereby being provided with an insulating property.

Therefore, it is preferable to use IZO as the material of the lower electrode, also from the viewpoints of avoiding enlargement of the effective area of the lower electrode, which is described later, and preventing concentration of electrical fields to an edge portion of the lower electrode.

The lower electrode has a thickness of preferably from 20 nm to 500 nm, and more preferably from 30 nm to 200 nm, from the viewpoint of suppressing the leakage current from the insulating film.

The method of forming the lower electrode is not particularly limited. The lower electrode may be formed on the substrate by a method appropriately selected from wet methods such as printing or coating, physical methods such as vacuum deposition, sputtering, or ion-plating, and chemical methods such as CVD or plasma CVD, depending on the suitability of the method to the material of the lower electrode. For example, when ITO or IZO is used, the lower electrode may be formed by DC sputtering, high-frequency sputtering, vacuum deposition, ion-plating, or the like. When an organic electroconductive compound is used as the material of the lower electrode, the lower electrode can be formed by a wet film forming method.

The method of patterning the lower electrode (processing method) is not particularly limited. For example, the lower electrode film (solid film) which is formed by the method described above may be processed by a photo-etching method including a photolithography process and an etching process (wet etching or dry etching). Alternatively, a lift-off method in which formation of a resist pattern, formation of the lower electrode, and separation of the resist pattern are performed in this order may be employed. Alternatively, a shadow mask method may be employed in which a shadow mask is used in formation of the film to simultaneously perform film formation and patterning thereof.

The method of adjusting the taper angle of an edge portion cross-section of the lower electrode to 60° or less (which may be simply referred to as "taper adjustment" hereinafter) is not particularly limited. For example, the taper angle may be adjusted by controlling the etching conditions when the lower electrode is processed by the photo-etching method, after the formation of the lower electrode.

Specifically, for example, in a case of wet etching, the taper angle may be adjusted using a diluted etching liquid. The lower the concentration of the etching liquid is, the lower the etching speed is; therefore, the taper angle tends to be smaller.

The taper angle may be adjusted by controlling the adhesion property to the resist pattern (a resist pattern formed using a photo resist). A lower adhesion property of the resist pattern enables a smaller taper angle. The adhesion property to the resist pattern may be controlled by changing the post-baking temperature of the resist pattern. For example, there is a tendency for a lower post-baking temperature to cause a lower adhesion property.

In a case of dry etching, incorporation of oxygen into the etching gas allows the lower electrode film to be etched while the resist pattern is receded by the etching; therefore, the taper angle of the lower electrode film can easily be adjusted to the range described above.

Oxidation Treatment

It is preferable that an edge portion (particularly, side surfaces) of the lower electrode used in the invention has been subjected to an oxidization treatment.

The oxidation treatment imparts an insulating property to an edge portion of the lower electrode, and suppresses enlargement of the effective area of the lower electrode, which may occur when the taper angle is 60° or less. Furthermore, concentration of electrical fields to a lower edge of the lower electrode, which may occur when the taper angle is 60° or less, is prevented.

However, when IZO is used as the material of the lower electrode, an edge portion of the lower electrode are spontaneously oxidized and acquires an insulating property, as described above. Therefore, the oxidation treatment is particularly effective when a material other than IZO (for example, a metal or an alloy) is used as the material of the lower electrode.

The method of the oxidation treatment is not particularly limited, and an oxygen plasma treatment or an UV ozone treatment may be used, for example. A combination of these treatments may be used.

Conditions of the oxygen plasma treatment are not particularly limited. For example, the oxygen plasma treatment may be performed at an oxygen pressure of from 0.5 to 50 Pa and a RF power of from 50 W to 1,000 W, for from 10 seconds to 2 minutes.

Conditions of the UV ozone treatment are not particularly limited. For example, an ultraviolet (UV) radiation having a wavelength of from 180 nm to 300 nm is preferably used in the UV ozone treatment.

It is preferable that the oxidation treatment is selectively performed on an edge portion of the lower electrode.

For example, the selective oxidation treatment to an edge portion of the lower electrode may be performed as described below.

First, a lower electrode film is formed by, for example, sputtering. A resist pattern is then formed on the thus-formed lower electrode film by using a photo resist, and the lower electrode film is etched using the thus-formed resist pattern as an etching mask. As a result, only the edge portions (side surfaces) of the lower electrode are exposed. The lower electrode in this state is subjected to an oxidation treatment before the resist pattern is removed therefrom, whereby the edge portions of the lower electrode are selectively subjected to the oxidation treatment. After that, the resist pattern is removed using a known resist stripper liquid.

Insulating Film

The electronic device of the invention has an insulating film provided on the lower electrode.

The insulating film to be used in the invention is preferably a $SiO_2$ film which contains hydrogen atoms in a ratio of 3 atomic % or less, and which has a refractive index n of 1.475 or less at a wavelength of 650 nm.

The insulating film to be used in the invention may have, for example, any of the following configurations: (1) when the electronic device of the invention is a capacitor, the insulating film is a dielectric component provided in the capacitor; (2) when the electronic device of the invention is a bottom gate thin film transistor, the insulating film is a gate insulating film provided in the thin film transistor; and (3) when the electronic device of the invention is a top gate thin film transistor, the insulating film is a gate insulating film provided in the thin film transistor.

In general, when a $SiO_2$ film which is formed by sputtering and contains hydrogen atoms in a ratio of 3 atomic % or less is used in an electronic device, the leakage current tends to increase. Accordingly, the effect of suppressing leakage current of the invention is significantly exerted when a $SiO_2$ film which is formed by sputtering and contains hydrogen atoms in a ratio of 3 atomic % or less is used in an electronic device.

Here, the hydrogen atom content ratio contained in a $SiO_2$ film is a value measured by hydrogen forward scattering spectrometry (HFS spectrometry).

As a method of adjusting the hydrogen atom content ratio in a $SiO_2$ film to 3 atomic % or less, sputtering may be used instead of CVD.

In the invention, when the refractive index n exceeds 1.475 at a wavelength of 650 nm, the leakage current increases.

Here, the refractive index of a $SiO_2$ film at a wavelength of 650 nm is a value measured using a spectroscopic ellipsometer.

For adjusting the refractive index n to 1.475 or less at a wavelength of 650 nm, a $SiO_2$ film may be formed, for example, under low pressure conditions (for example, under a condition of a pressure of from 0.05 Pa to 0.3 Pa, and more preferably from 0.1 Pa to 0.2 Pa, during sputtering).

In the sputtering process, the oxygen concentration is preferably from 3 volume % to 50 volume %, and more preferably from 5 volume % to 20 volume %.

As described above, it is preferable that the $SiO_2$ film to be used in the invention is formed by sputtering under the conditions of a pressure of from 0.05 Pa to 0.3 Pa, and more preferably from 0.1 Pa to 0.2 Pa, during sputtering, from the viewpoint of attaining the above-described hydrogen atom content ratio and refractive index.

The upper limit of the temperature of the substrate in the sputtering is preferably 200° C. or less, more preferably 150° C. or less, and further more preferably 100° C. or less, from the viewpoint of preventing a damage to the substrate when the substrate is a plastic substrate.

In the above ranges, the upper limit is further more preferably 75° C. or less, and particularly preferably 50° C. or less.

Here, the substrate temperature during sputtering is measured using a thermal label attached to the substrate.

Hereinafter, a further more preferable example of the sputtering condition, from the viewpoint of attaining the above-mentioned hydrogen atom content ratio and refractive index, is described. However, the invention is not particularly limited thereto.

The sputtering is preferably RF magnetron sputtering.

The target may be any of a $SiO_2$ target or a Si target. When the Si target is used, a $SiO_2$ film may be formed by reactive sputtering performed while introducing an oxygen gas.

The sputtering power is preferably from 0.05 $W/mm^2$ to 2.0 $W/mm^2$, and more preferably from 0.1 $W/mm^2$ to 1.0 $W/mm^2$.

The insulating film to be used in the invention (for example, a $SiO_2$ film) has a thickness of preferably from 50 nm to 1,000 nm, more preferably from 80 nm to 500 nm, and particularly preferably from 80 nm to 400 nm, from the viewpoint of suppressing the leakage current.

From the viewpoint of significantly suppressing the leakage current, a combination of an insulating film (for example, a $SiO_2$ film) having a thickness of from 80 nm to 500 nm and a lower electrode having a thickness of from 20 nm to 500 nm is preferable, and a combination of an insulating film (for example, a $SiO_2$ film) having a thickness of from 80 nm to 400 nm and a lower electrode having a thickness of from 30 nm to 200 nm is more preferable in the invention.

In the invention, the insulating film (for example, a $SiO_2$ film) may be provided at least on the entire upper surface of the lower electrode (except for a region at which a terminal for applying voltage is to be provided), and the insulating film may or may not be provided on an other region on the upper surface of the laminated body composed of at least the substrate and the lower electrode than the upper surface of the lower electrode.

In an example of the configuration of the insulating film to be used in the invention, the insulating film is formed on the entire upper surface of the laminated body composed of at least the substrate and the lower electrode, including the entire upper surface of the lower electrode (except for a region at which a terminal for applying voltage is to be provided) and the region of the upper surface of the laminated body other than the upper surface of the lower electrode. At the region where a terminal is to be provided, the insulating film is not formed so that the lower electrode is exposed. The exposure of the lower electrode at the region may be achieved by forming (or processing) the insulating film by, for example, a photo-etching method, a lift-off method, or a shadow mask method.

Upper Electrode

The electronic device of the invention has an upper electrode which is provided on the insulating film and which has an overlapping portion with the lower electrode.

The upper electrode to be used in the invention may have, for example, any of the following configurations: (1) when the electronic device of the invention is a capacitor, the upper electrode is one of a pair of electrodes (i.e., a counter electrode to the lower electrode) in the capacitor; (2) when the electronic device is a bottom gate transistor, the upper electrode is a source electrode or a drain electrode in the bottom gate transistor; (3) when the electronic device of the invention is a top gate transistor, the upper electrode is a gate electrode.

The material of the upper electrode is not particularly limited. Examples of the material include metals such as Al, Mo, Cr, Ta, Ti, Au, and Ag; alloys such as Al—Nd and APC; oxide electroconductive compounds such as tin oxide, zinc oxide, indium oxide, indium tin oxide (ITO), and indium zinc oxide (IZO); organic electroconductive compounds such as polyaniline, polythiophene, and polypyrrole; and mixtures thereof.

Of these, from the viewpoint of achieving a low electrical resistance, metals or alloys are preferable, and Al, Al—Nd, and Mo are more preferable.

The upper electrode has a thickness of preferably from 20 nm to 1,000 nm, and more preferably from 50 nm to 500 nm.

The method of forming the upper electrode is not particularly limited. The upper electrode may be formed by a method appropriately selected from wet methods such as printing or coating, physical methods such as vacuum deposition, sputtering, or ion-plating, chemical methods such as CVD or plasma CVD, and the like, depending on the suitability of the method to the materials of the upper electrode. For example, when a metal or alloy is used, the upper electrode can be formed by DC sputtering, high-frequency sputtering, vacuum deposition, or ion-plating. When at least one organic electroconductive compound is used as the material of the upper electrode, the upper electrode can be formed by a wet film forming method.

The upper electrode may be subjected to patterning, if necessary.

As a method of patterning, any of the photo-etching method, lift-off method, shadow mask method, or the like may be used without limitation.

The upper electrode to be used in the invention may be provided at least in a region on the insulating film, and may or may not be provided on an other region on the upper surface of the laminated body composed of at least the substrate, the lower electrode, and the insulating film than the upper surface of the insulating film.

The upper electrode in the invention has an overlapping portion with the lower electrode.

Specifically, the upper electrode to be used in the invention is provided in such a manner that a portion of the upper electrode is overlapping with the lower electrode when seen from the upper electrode side of the substrate in the normal line direction of the substrate.

In an example of the configuration of the upper electrode, one or more upper electrodes are patterned such that the patterned upper electrodes intersect the lower electrode when seen from the upper electrode side of the substrate in the normal line direction of the substrate.

Other Components

The electronic device of the invention may further include at least one other additional component in addition to the substrate, lower electrode, insulating film, and upper electrode.

An additional component may be arranged at any position selected from (i) between the substrate and the lower electrode, (ii) between the lower electrode and the insulating film, (iii) between the insulating film and the upper electrode, or (iv) on the upper electrode (on the side further away from the substrate).

Examples of additional components include a protective film and, when the electronic device of the invention is a transistor, a semiconductor layer.

When the electronic device of the invention is a transistor, the semiconductor layer preferably contains an oxide semiconductor from the viewpoint that the film can be formed at low temperatures. In particular, the oxide semiconductor is more preferably amorphous.

The oxide semiconductor is preferably an oxide semiconductor containing at least one selected from the group consisting of In, Ga, and Zn or a composite oxide thereof. Specifically, an amorphous oxide semiconductor (such as IGZO) disclosed in JP-A No. 2006-165529 is particularly preferable.

Embodiments

Next, preferable embodiments of the electronic device of the invention are described by referring to FIGS. 4 to 8. However, the invention is not limited to these embodiments.

Figure 4:
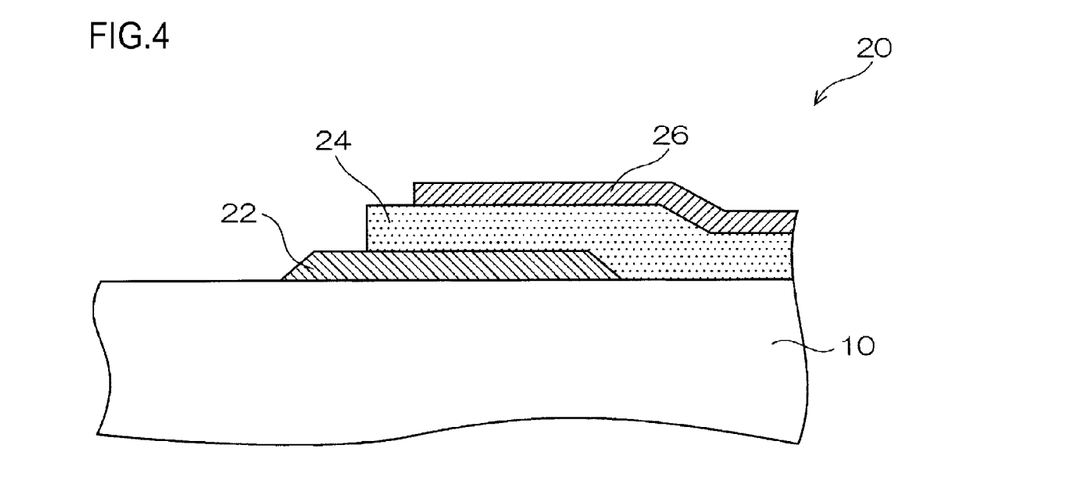
FIG. 4 is a schematic cross-sectional view of an electronic device according to a first embodiment of the invention.

FIG. 4 is a schematic cross-sectional view of a capacitor 20 that is an electronic device according to a first embodiment of the invention.

As shown in FIG. 4, the capacitor 20 has, on a substrate 10, a lower electrode 22, a $SiO_2$ film 24 provided on the lower electrode 22, and an upper electrode 26 which is provided on the $SiO_2$ film 24 and has an overlapping portion with the lower electrode 22.

In the capacitor 20, a voltage is applied between the upper electrode 26 and the lower electrode 22, and an electrical capacitance is stored in a portion of the $SiO_2$ film 24 which corresponds to the overlapping portion of the upper electrode 26 with the lower electrode 22. In this case, owing to the taper angle of an edge portion cross-section of the lower electrode and the refractive index n of the $SiO_2$ film, the leakage current between the upper electrode 26 and the lower electrode 22 is suppressed.

Figure 5:
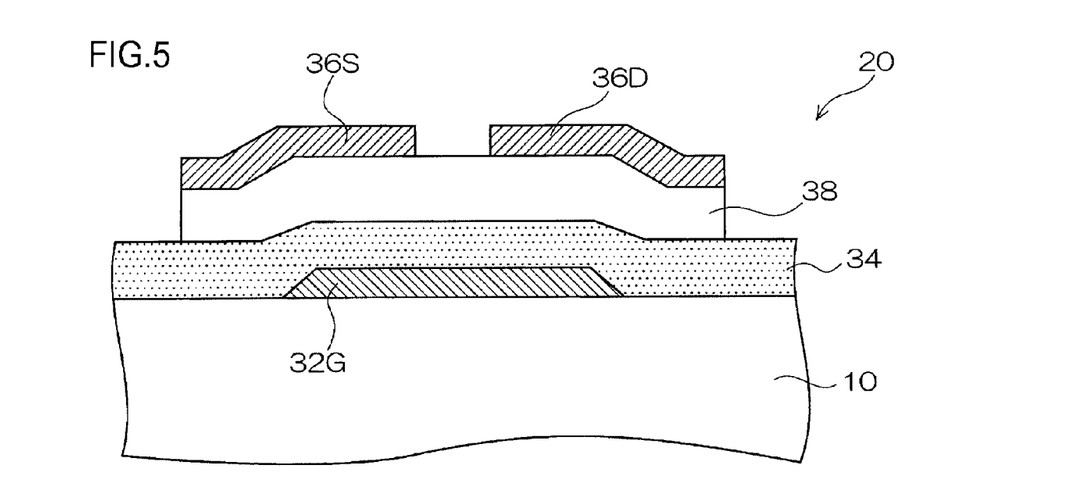
FIG. 5 is a schematic cross-sectional view of an electronic device according to a second embodiment of the invention.

FIG. 5 is a schematic cross-sectional view of a bottom gate (inversely-staggered) thin film transistor 30 that is an electronic device according to a second embodiment of the invention.

As shown in FIG. 5, the thin film transistor 30 has, on a substrate 10, a lower electrode 32G that serves as a gate electrode, a $SiO_2$ film 34 which is a gate insulating film and provided on the lower electrode 32G, and a semiconductor layer 38 which is provided on the $SiO_2$ film 34 and has an island pattern. The thin film transistor 30 further has, on the semiconductor layer 38, an upper electrode 36S as a source electrode and an upper electrode 36D as a drain electrode, which have overlapping portions with the lower electrode 32G.

In the thin film transistor 30, the leakage current between the upper electrode 36S and/or upper electrode 36D and the lower electrode 32G is suppressed, and the off-state current is reduced. Accordingly, a transistor having an excellent on/off ratio (on-state current/off-state current ratio) is obtained.

Figure 6:
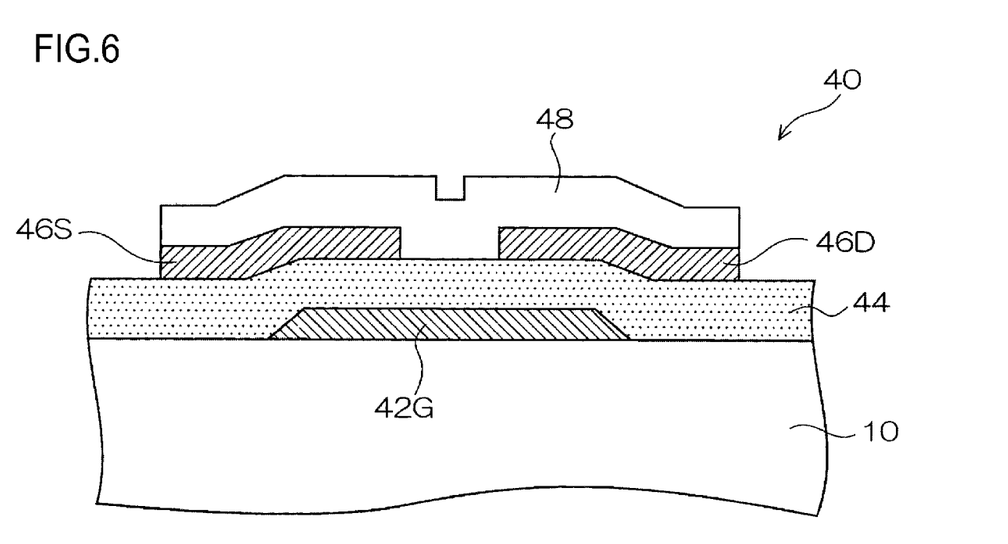
FIG. 6 is a schematic cross-sectional view of an electronic device according to a third embodiment of the invention.

FIG. 6 is a schematic cross-sectional view of a bottom gate (inversely-staggered) thin film transistor 40 that is an electronic device according to a third embodiment of the invention.

As shown in FIG. 6, the thin film transistor 40 has, on a substrate 10, a lower electrode 42G that serves as a gate electrode, a $SiO_2$ film 44 which is a gate insulating film and provided on the lower electrode 42G, and an upper electrode 46S as a source electrode and an upper electrode 46D as a drain electrode, which are provided on the $SiO_2$ film 44 and have overlapping portions with the lower electrode 42G. The thin film transistor 40 further has a semiconductor layer 48 having an island pattern such that the semiconductor layer 48 covers the upper electrode 46S, the upper electrode 46D, and a portion of the $SiO_2$ film 44 located between the upper electrode 46S and the upper electrode 46D.

In the thin film transistor 40, the leakage current between the upper electrode 46S and/or upper electrode 46D and the lower electrode 42G is suppressed, and the off-state current is reduced. Accordingly, a transistor having an excellent on/off ratio (on-state current/off-state current ratio) is obtained.

Figure 7:
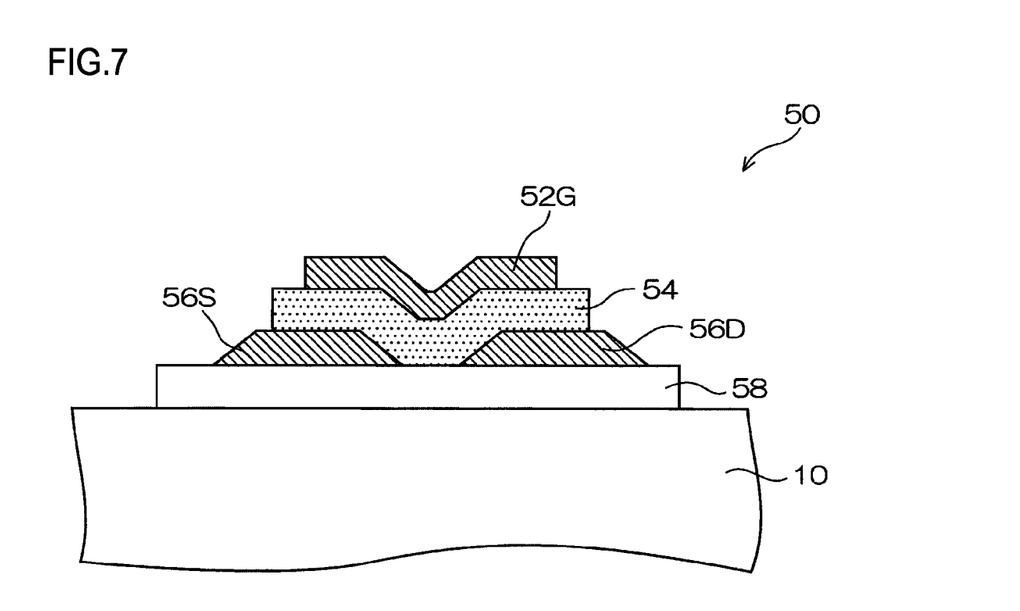
FIG. 7 is a schematic cross-sectional view of an electronic device according to a fourth embodiment of the invention.

FIG. 7 is a schematic cross-sectional view of a top gate (staggered) thin film transistor 50 that is an electronic device according to a fourth embodiment of the invention.

As shown in FIG. 7, the thin film transistor 50 has, on a substrate 10, a semiconductor layer 58 having an island pattern, and a lower electrode 56S that serves as a source electrode and a lower electrode 56D that serves as a drain electrode, which are provided on the semiconductor layer 58. The thin film transistor 50 further has a $SiO_2$ film 54 which is a gate insulating film having an island pattern and provided so as to cover a portion of the lower electrode 56S and lower electrode 56D and a region (channel region) on the semiconductor layer 58 located between the lower electrode 56S and the lower electrode 56D. Furthermore, on the $SiO_2$ film 54, an upper electrode 52G as a gate electrode is provided so as to have overlapping portions with the lower electrode 56S and the lower electrode 56D.

In the thin film transistor 50, the leakage current between the lower electrode 56S and/or lower electrode 56D and the upper electrode 52G is suppressed, and off-state current is reduced. Accordingly, a transistor having an excellent on/off ratio (on-state current/off-state current ratio) is obtained.

Figure 8:
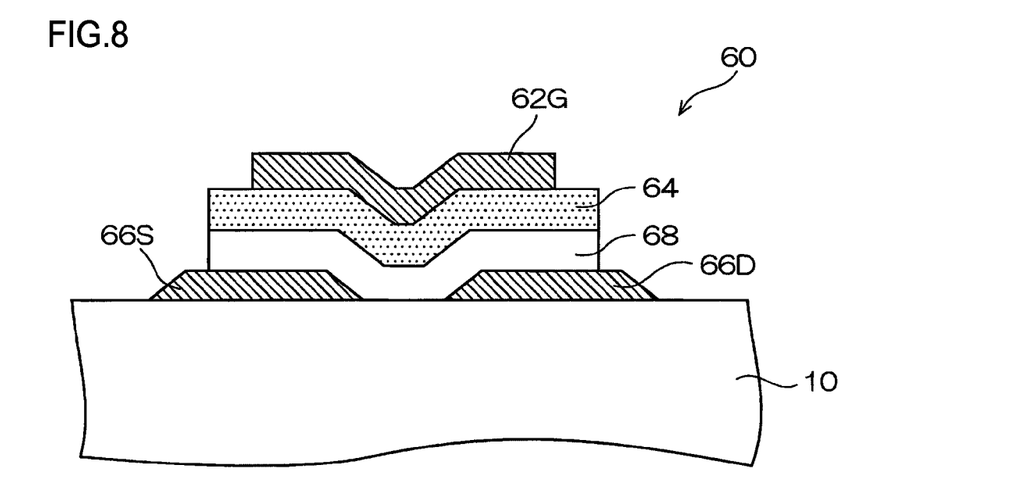
FIG. 8 is a schematic cross-sectional view of an electronic device according to a fifth embodiment of the invention.

FIG. 8 is a schematic cross-sectional view of a top gate (staggered) thin film transistor 60 of an electronic device according to a fifth embodiment of the invention.

As shown in FIG. 8, the thin film transistor 60 has, on a substrate 10, a lower electrode 66S that serves as a source electrode, and a lower electrode 66D that serves as a drain electrode. Furthermore, a semiconductor layer 68 having an island pattern is provided so as to cover the lower electrode 66S, the lower electrode 66D, and a region (channel region) on the substrate 10 located between the lower electrode 66S and the lower electrode 66D. The thin film transistor 60 further has, on the semiconductor layer 68, a $SiO_2$ film 64 that serves as a gate insulating film having an island pattern. Furthermore, on the $SiO_2$ film 64, an upper electrode 62G that serves as a gate electrode is provided so as to have overlapping portions with the lower electrode 66S and the lower electrode 66D.

In the thin film transistor 60, the leakage current between the lower electrode 66S and/or lower electrode 66D and the upper electrode 62G is suppressed, and off-state current is reduced. Accordingly, a transistor having an excellent on/off ratio (on-state current/off-state current ratio) is obtained.

The first to fifth embodiments of the invention are described above; however, the electronic device of the invention is not limited to these embodiments.

The applications of the above-described electronic device of the invention are not particularly limited. The electronic device of the invention may be used for, for example, display devices, X-ray sensors, or capacitors. In particular, the electronic device of the invention is preferably used for a display device (such as a liquid crystal display device and an organic EL display device).

Hereinafter, a display device of the invention including the electronic device of the invention is described.

Figure 9:
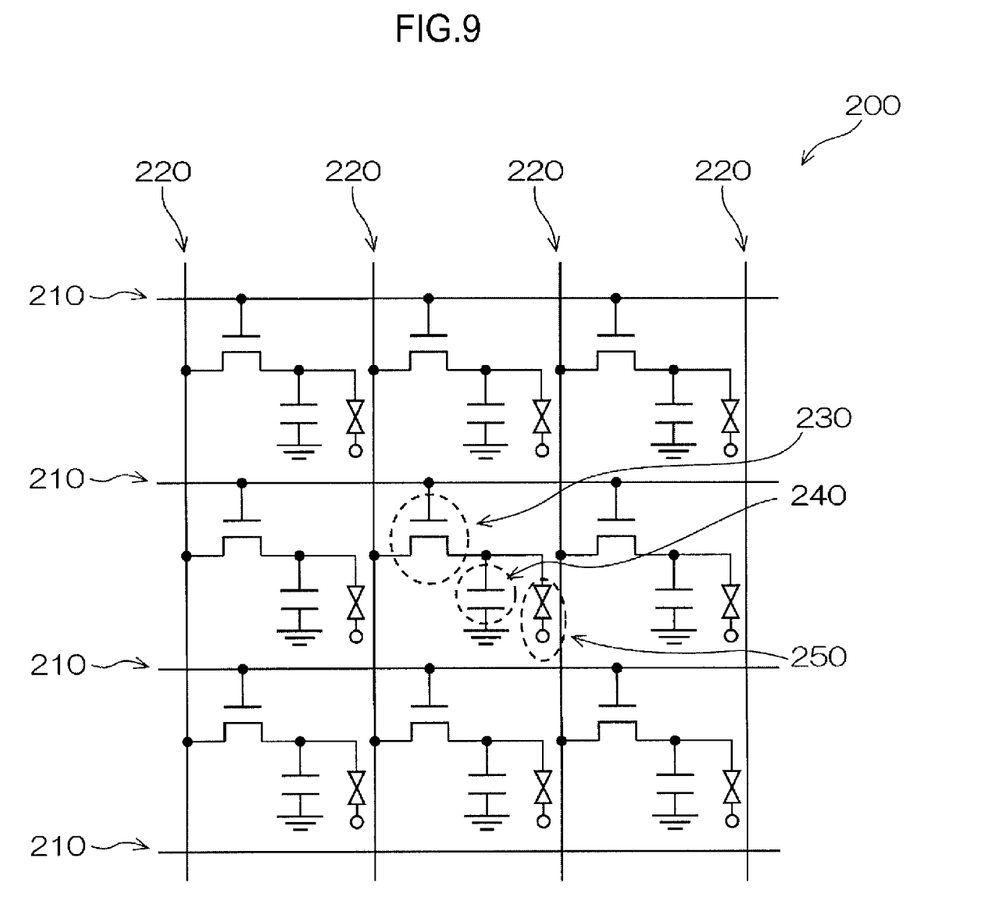
FIG. 9 is a schematic structural view of an example of a display device of the invention.

FIG. 9 is a schematic configuration view of a liquid crystal display device 200 that is an example of the display device of the invention.

As shown in FIG. 9, the liquid crystal display device 200 has plural gate lines 210 which are arranged parallel to one another, and plural drain lines 220 which are arranged parallel to one another and intersect with the gate lines 210. Here, the gate lines 210 are electrically insulated from the drain lines 220. Thin film transistors 230 are arranged near the intersections between the gate lines 210 and the drain lines 220.

A gate electrode of a thin film transistor 230 is connected to any one of the gate lines 210, and a drain electrode of the thin film transistor 230 is connected to a drain line 220. The source electrode of the thin film transistor 230 is connected to a pixel electrode, and a liquid crystal 250 is held in a region between the pixel electrode and a counter electrode (not shown). Furthermore, the pixel electrode and the counter electrode that is connected to ground form a capacitor 240.

The electronic device of the invention is preferably used as, for example, the capacitor 240 or the thin film transistor 230. In this case, the leakage current in the capacitor 240 and the thin film transistor 230 is suppressed, and the display quality thereof is improved.

According to the invention, since a low process temperature of 200° C. or less can be used, a flexible liquid crystal display device exerting an excellent display quality, a flexible organic EL display device exerting an excellent display quality, and the like can be provided.

EXAMPLES

Hereinafter, the invention will be described in more detail by referring to Examples. However, the invention is not particularly limited to these. Unless otherwise specifically stated, "part(s)" and "%" are on the mass basis.

Example 1

Production of Electronic Device

Formation of Lower Electrode
Formation of IZO Film

An IZO film having a thickness of 100 nm was formed by sputtering under the following conditions on a PEN film substrate having a thickness of 150 μm (trade name: Q65FA, manufactured by Teijin DuPont Films Japan Ltd.).

In the conditions described below, the substrate temperature was measured using a thermal label attached to the side of the substrate at which the IZO film was formed. (The measurement of the substrate temperature in the $SiO_2$ sputtering and Al sputtering described below is performed in the same manner.)

In the following description, "sccm" is an abbreviation of "standard cc/min" which is a value indicating a volume (cc) of a gas that is to be introduced in an sputtering apparatus per 1 minute, which is calculated in terms of standard conditions (1013.25 hPa (1 atmosphere), 0° C.). For example, in the invention, "1 sccm" indicates that a flow rate of a gas at 1013.25 hPa (1 atmosphere) and 0° C. is 1 cm³/min.

IZO Film Sputtering Conditions

| | |
|---|---|
| Sputtering apparatus: | DC magnetron sputtering apparatus |
| Target: | 3-Inch IZO target (purity: 4N; manufactured by Idemitsu Kosan Co., Ltd.) |
| Substrate temperature: | Room temperature (from 20° C. to 37° C.) |
| Sputtering power: | 100 W using a DC power source |
| Pressure (at the time of gas introduction): | 0.4 Pa |
| Introduced gas and flow rate: | Ar = 97 sccm; $O_2$ = 3.0 sccm |

Patterning of IZO Film

Subsequently, on the thus-formed IZO film, a resist pattern for forming a lower electrode was formed using a photo resist AZ-5124E (trade name, manufactured by Clariant).

The resist pattern was a straight line-shaped pattern having a line width of 200 µm.

Then, the IZO film was subjected to wet etching using the thus-obtained resist pattern as a mask and a two-fold dilution of a wet etching liquid ITO-6N (trade name, manufactured by Kanto Kagaku) as an etchant.

The wet etching of the IZO film was conducted at a liquid temperature of 27° C.

The ITO-6N etching liquid is an aqueous oxalic acid liquid.

Subsequently, the resist pattern was removed using a resist stripper liquid AZ-REMOVER (trade name, manufactured by Clariant).

In this manner, a lower electrode that was a patterned IZO film (hereinafter, may be referred to as "IZO pattern") was formed.

The lower electrode was a straight line-shaped IZO pattern having a thickness of 100 nm and a line width of 200 µm.

Formation of $SiO_2$ Film

Next, at the lower electrode formation side (the side further away from the substrate), a $SiO_2$ film having a thickness of 200 nm was formed by sputtering under the conditions described below.

The $SiO_2$ film was formed so as to cover almost the entire surface of the lower electrode; however a portion thereof (a region at which a terminal for applying voltage was to be formed) was left exposed by using a shadow mask in the sputtering.

$SiO_2$ Sputtering Conditions

| | |
|---|---|
| Sputtering apparatus: | RF magnetron sputtering apparatus |
| Target: | 3-Inch $SiO_2$ target (purity: 4N, manufactured by Furuuchi Chemical Corporation) |
| Substrate temperature: | 43° C. |
| Sputtering power: | 200 W using a RF power source |
| Pressure (at the time of gas introduction): | 0.16 Pa |
| Introduced gas and flow rate: | Ar = 40 sccm; $O_2$ = 4.5 sccm |

Formation of Upper Electrode
Formation of Al Film

Next, at the $SiO_2$ film formation side (the side further away from the substrate), an Al film having a thickness of 200 nm was formed by sputtering under the following conditions.

Al Film Sputtering Conditions

| | |
|---|---|
| Sputtering apparatus: | DC magnetron sputtering apparatus |
| Target: | 3-Inch Al target (purity: 4N, manufactured by Furuuchi Chemical Corporation) |
| Substrate temperature: | Room temperature (from 20° C. to 37° C.) |
| Sputtering power: | 400 W using a DC power source |
| Pressure (at the time of gas introduction): | 0.34 Pa |
| Introduced gas and flow rate: | Ar = 15 sccm |

Patterning of Al Film

Next, on the thus-formed Al film, a resist pattern for forming an upper electrode was formed using a photo resist AZ-5124E (trade name, manufactured by Clariant).

The resist pattern was a straight line-shaped pattern which had a line width of 200 µm and perpendicularly intersected the straight line-shaped pattern of the lower electrode.

Then, the Al film was subjected to wet etching using the thus-obtained resist pattern as a mask and a wet etching liquid (an Al etching liquid manufactured by Kanto Kagaku) as an etchant.

Subsequently, the resist pattern was removed using a resist stripper liquid AZ-REMOVER (trade name, manufactured by Clariant).

In this manner, an upper electrode that was a patterned Al film was formed.

The upper electrode was a straight line-shaped Al pattern which had a thickness of 200 nm and a line width of 200 µm, and perpendicularly intersected with the lower electrode (in other words, a pattern having an overlapping portion with the lower electrode).

In this manner, an electronic device was obtained which had, on the substrate, the lower electrode, the $SiO_2$ film provided on the lower electrode, and the upper electrode which was provided on the $SiO_2$ film and had an overlapping portion with the lower electrode.

Measurement and Evaluation

The thus-obtained electronic device was subjected to measurement and evaluation as described below.

The results of the measurement and evaluation are shown in Table 1.

Measurement of Taper Angle of Edge Section of Lower Electrode

The electronic device obtained as described above was cut in a plane perpendicular to the substrate and perpendicular to the lower electrode edges (pattern edges), and a picture of the cross-section of an edge portion of the lower electrode was taken using a transmission electron microscope (TEM) at a magnification of 400,000.

Using the TEM picture, the taper angle of an edge portion cross-section of the lower electrode was measured.

Here, the taper angle was referred to an angle between the straight line connecting the upper end and the lower end of the edge of the lower electrode and the straight line corresponding to the surface of the lower electrode that was in contact with the substrate.

Measurement of Hydrogen Atom Content Ratio in $SiO_2$ Film

The hydrogen atom content ratio in the $SiO_2$ film of the electronic device obtained as described above was measured by HFS spectrometry.

The results are shown in Table 1.

Measurement of Refractive Index of SiO₂ Film

The refractive index of the SiO$_2$ film of the electronic device obtained as described above was measured using a spectroscopic ellipsometer (trade name: MASS-104FH manufactured by FiveLab Co., Ltd.) at a wavelength of 650 nm.

The results are shown in Table 1.

Measurement of Leakage Current

The leakage current in the electronic device obtained as described above was measured using a semiconductor parameter analyzer 4155C (trade name, manufactured by Agilent).

The leakage current was measured as a current density (A/cm$^2$) of a current that flows between the upper electrode and the lower electrode when a voltage of 10 V was applied.

Under the above conditions, a leakage current of $1.0 \times 10^{-9}$ A/cm$^2$ or less is in a practically tolerable range.

Example 2

An electronic device was produced in the same manner as in Example 1 except that the lower electrode used in Example 1 was changed to a lower electrode which was a MoNb film having a thickness of 40 nm, and the measurement and evaluation were conducted in the same manner as in Example 1.

The results of the measurement and evaluation are shown in Table 1.

The method of forming the lower electrode in Example 2 is specifically described below.

Formation of Lower Electrode (MoNb Film)
Formation of MoNb Film

A MoNb film having a thickness of 40 nm was formed by sputtering under the following conditions on a PEN film substrate having a thickness of 150 μm (trade name: Q65FA, manufactured by Teijin DuPont Films Japan Ltd.).

The substrate temperature was measured according to the same method as that employed in Example 1 (IZO film).

MoNb Film Sputtering Conditions

| | |
|---|---|
| Sputtering apparatus: | DC magnetron sputtering apparatus |
| Target: | MoNb target having a diameter of 120 mm (purity: 3N; amount of Nb added: 5% by mass; manufactured by Hitachi Metals Ltd.) |
| Substrate temperature: | Room temperature (from 20° C. to 37° C.) |
| Sputtering power: | 300 W using a DC power source |
| Pressure (at the time of gas introduction): | 0.2 Pa |
| Introduced gas and flow rate: | Ar = 58.5 sccm |

Patterning of MoNb Film

Subsequently, on the thus-formed MoNb film, a resist pattern for forming a lower electrode was formed using a photo resist AZ-5124E (trade name, manufactured by Clariant).

The resist pattern was a straight line-shaped pattern having a line width of 200 μm.

Then, the MoNb film was subjected to wet etching using the thus-formed resist pattern as a mask and a Mo etching liquid TSL (trade name, manufactured by Hayashi Pure Chemical Industry Ltd.) as an etchant.

The wet etching of the MoNb film was conducted at a liquid temperature of 25° C.

Subsequently, the resist pattern was removed using a resist stripper liquid AZ-REMOVER (trade name, manufactured by Clariant).

In this manner, a lower electrode that was a patterned MoNb film (which may be hereinafter referred to as "MoNb pattern") was formed.

The lower electrode was a straight line-shaped MoNb pattern having a thickness of 40 nm and a line width of 200 μm.

Comparative Example 1

An electronic device was produced in the same manner as in Example 1 except that the etching liquid used for the wet etching of the IZO film in Example 1 was changed to a two-fold dilution of ITO-02 (trade name, manufactured by Kanto Kagaku), and the measurement and evaluation were conducted in the same manner as in Example 1.

The results of the measurement and evaluation are shown in Table 1.

The ITO-02 etching liquid is an aqueous mixture solution of nitric acid and hydrochloric acid.

Comparative Example 2

An electronic device was produced in the same manner as in Example 1 except that the pressure (at the time of gas introduction) in the SiO$_2$ sputtering conditions was changed from 0.16 Pa, which was used in Example 1, to 0.4 Pa, and the measurement and evaluation were conducted in the same manner as in Example 1.

The results of the measurement and evaluation are shown in Table 1.

Comparative Example 3

An electronic device was produced in the same manner as in Example 1 except that the etching liquid used for wet etching of the IZO film was changed to a two-fold dilution of ITO-02 (trade name, manufactured by Kanto Kagaku), and the pressure (at the time of gas introduction) in the SiO$_2$ sputtering conditions was changed from 0.16 Pa to 0.4 Pa, and the measurement and evaluation were conducted in the same manner as in Example 1.

The results of the measurement and evaluation are shown in Table 1.

TABLE 1

| | Lower electrode Taper angle of edge portion cross-section (°) | SiO$_2$ film | | |
|---|---|---|---|---|
| | | Hydrogen atom content ratio (atomic %) | Refractive index at 650 nm | Leakage current (A/cm$^2$) |
| Example 1 | 25 | 0.8 | 1.468 | $2.6 \times 10^{-10}$ |
| Example 2 | 38 | 0.8 | 1.468 | $2.7 \times 10^{-10}$ |
| Comparative Example 1 | 90 | 0.8 | 1.468 | $3.0 \times 10^{-9}$ |
| Comparative Example 2 | 25 | 1.0 | 1.479 | $2.5 \times 10^{-8}$ |
| Comparative Example 3 | 90 | 1.0 | 1.479 | $2.4 \times 10^{-8}$ |

As shown in Table 1, when the taper angle of the edge portion cross-section of the lower electrode was 60° or less and the refractive index n of the SiO$_2$ film at a wavelength of 650 nm was 1.475 or less as in Examples 1 and 2, the leakage current was suppressed.

In contrast, the leakage current increased in Comparative Example 1 in which the taper angle of the edge portion cross-section of the lower electrode exceeded 60°, in Comparative Example 2 in which the refractive index n of the SiO$_2$ film at a wavelength of 650 nm exceeded 1.475, and in Comparative Example 3 in which the taper angle of the edge portion cross-section of the lower electrode exceeded 60° and the refractive index n of the SiO$_2$ film at a wavelength of 650 nm exceeded 1.475.

In the above Examples, capacitors having configurations in which a SiO$_2$ film was sandwiched between a lower electrode and an upper electrode were described as examples of the electronic device of the invention. However, the electronic device of the invention is not limited to a capacitor.

For example, a bottom gate thin film transistor can be produced by providing a lower electrode as a gate electrode, providing upper electrodes as a source electrode and a drain electrode, and providing a semiconductor layer in the region between the SiO$_2$ film and the upper electrode (or on top of the SiO$_2$ film and the upper electrode).

Alternatively, a top gate thin film transistor can be produced by providing lower electrodes as a source electrode and a drain electrode, providing an upper electrode as a gate electrode, and providing a semiconductor layer in the region between the lower electrode and the SiO$_2$ film (or below the lower electrode (at a position further toward the substrate than the lower electrode and the SiO$_2$ film)).

In either case, a thin film transistor can be obtained in which the leakage current (off-state current) is suppressed and which has excellent transistor properties such as a high on/off ratio (on-state current/off-state current ratio).

When the thin film transistor, capacitor, or the like is used as a constituent component, a display device having excellent display quality, in which the leakage current is suppressed, can be obtained.

Furthermore, since, in the invention, an electronic device in which the leakage current is suppressed is produced at a low temperature of 200° C. or less, at which films can be formed on a plastic substrate, a flexible electronic device having excellent leakage properties can be obtained.

Moreover, when the invention is applied to a lower electrode, a gate insulating film, and an upper electrode of a TFT, a liquid crystal display device, organic EL display device, or the like which has excellent display quality can be formed on a plastic substrate.

In other words, according to the invention, a flexible display device can be produced using a plastic substrate.

According to the invention, an electronic device which is produced at a low temperature and in which the leakage current is suppressed, and a method of producing the electronic device are provided.

According to the invention, a display device is provided which is produced at a low temperature and has excellent display quality.

Embodiments of the present invention include, but are not limited to, the following.

<1> An electronic device comprising:
a substrate;
a lower electrode which is provided on the substrate and has an edge portion cross-section having a taper angle of 60° or less;
a SiO$_2$ film which is provided on the lower electrode, the SiO$_2$ film comprising hydrogen atoms in a ratio of 3 atomic % or less, and having a refractive index n of 1.475 or less at a wavelength of 650 nm; and
an upper electrode which is provided on the SiO$_2$ film and has an overlapping portion with the lower electrode.

<2> The electronic device according to <1>, wherein the lower electrode comprises an oxide electroconductive film.

<3> A method of producing an electronic device, the method comprising:
forming, on a substrate, a lower electrode which has an edge portion cross-section having a taper angle of 60° or less;
forming an insulating film on the lower electrode by sputtering; forming an upper electrode on the insulating film in such a manner that the upper electrode has an overlapping portion with the lower electrode.

<4> The method of producing an electronic device according to <3>, wherein, in the formation of the insulating film, the insulating film is formed at a substrate temperature of 200° C. or less.

<5> The method of producing an electronic device according to <3> or <4>, wherein the insulating film comprises a SiO$_2$ film having a refractive index n of 1.475 or less at a wavelength of 650 nm.

<6> The method of producing an electronic device according to any one of <3> to <5>, wherein the lower electrode comprises an oxide electroconductive film.

<7> A display device comprising the electronic device according to <1> or <2>.

All publications, patent applications, and technical standards mentioned in this specification are herein incorporated by reference to the same extent as if each individual publication, patent application, or technical standard was specifically and individually indicated to be incorporated by reference.

What is claimed is:

1. An electronic device comprising:
a substrate;
a lower electrode which is provided on the substrate and has an edge portion cross-section having a taper angle of 60° or less;
a SiO$_2$ film which is provided on the lower electrode, the SiO$_2$ film comprising hydrogen atoms in a ratio of 3 atomic % or less, and having a refractive index n of 1.475 or less at a wavelength of 650 nm; and
an upper electrode which is provided on the SiO$_2$ film and has an overlapping portion with the lower electrode.

2. The electronic device according to claim 1, wherein the lower electrode comprises an oxide electroconductive film.

3. A display device comprising the electronic device according to claim 1.

4. The electronic device of claim 1, wherein the lower electrode is subjected to an oxygen plasma treatment or a UV ozone treatment.

5. The electronic device according to claim 1, wherein a material of the lower electrode is at least one selected from the group consisting of Al, Mo, Cr, Ta, Ti, Au, Ag Al—Nd, APC, and Mo—Nb.

6. The electronic device according to claim 2, wherein a material of the oxide electroconductive film is indium zinc oxide (IZO).

7. A method of producing an electronic device, the method comprising, in the following order:
forming, on a substrate, a lower electrode which has an edge portion cross-section having a taper angle of 60° or less;
forming an insulating film on the lower electrode by performing sputtering at a pressure of 0.05 Pa to 0.3 Pa; and
forming an upper electrode on the insulating film in such a manner that the upper electrode has an overlapping portion with the lower electrode.

8. The method of producing an electronic device according to claim 7, wherein, in the formation of the insulating film, the insulating film is formed at a substrate temperature of 200° C. or less.

9. The method of producing an electronic device according to claim 7, wherein the insulating film comprises a SiO$_2$ film having a refractive index n of 1.475 or less at a wavelength of 650 nm.

10. The method of claim 7, wherein the sputtering is performed at a pressure of from 0.1 Pa to 0.2 Pa.

11. The method of claim 7, wherein the lower electrode is further subjected to an oxygen plasma treatment or a UV ozone treatment.

12. The method according to claim 7, wherein a material of the lower electrode is at least one selected from the group consisting of Al, Mo, Cr, Ta, Ti, Au, Ag Al—Nd, APC, and Mo—Nb.

13. The method of producing an electronic device claim 7, wherein the lower electrode comprises an oxide electroconductive film.

14. The method according to claim 13, wherein a material of the oxide electroconductive film is indium zinc oxide (IZO).

* * * * *